(12) United States Patent
Wang

(10) Patent No.: US 7,840,383 B2
(45) Date of Patent: Nov. 23, 2010

(54) OPERATIONALIZING A POWER USAGE MONITORING SYSTEM

(76) Inventor: Eugene Wang, 620 Lowell Ave., Palo Alto, CA (US) 94301

(*) Notice: Subject to any disclaimer, the term of this patent is extended or adjusted under 35 U.S.C. 154(b) by 112 days.

(21) Appl. No.: 12/384,120

(22) Filed: Apr. 1, 2009

(65) Prior Publication Data
US 2010/0256828 A1  Oct. 7, 2010

(51) Int. Cl.
G01R 21/00 (2006.01)

(52) U.S. Cl. .................. 702/188; 702/60; 702/61; 702/62; 324/113; 324/76.11; 700/295; 700/276; 340/870.01

(58) Field of Classification Search .......... 702/60, 702/61, 62, 188; 705/40, 412; 340/870.01; 700/295, 286, 276, 275; 370/222, 315; 324/113, 324/76.17, 76.11
See application file for complete search history.

(56) References Cited

U.S. PATENT DOCUMENTS

| | | | |
|---|---|---|---|
| 4,253,151 A * | 2/1981 | Bouve | 700/295 |
| 4,644,320 A * | 2/1987 | Carr et al. | 340/310.16 |
| 5,115,967 A * | 5/1992 | Wedekind | 236/46 R |
| 5,491,473 A * | 2/1996 | Gilbert | 340/870.01 |
| 7,058,524 B2 * | 6/2006 | Hayes et al. | 702/62 |
| 7,463,986 B2 * | 12/2008 | Hayes | 702/62 |
| 2003/0225483 A1 * | 12/2003 | Santinato et al. | 700/295 |
| 2004/0078153 A1 * | 4/2004 | Bartone et al. | 702/57 |
| 2006/0271314 A1 * | 11/2006 | Hayes | 702/62 |
| 2007/0058332 A1 * | 3/2007 | Canterbury et al. | 361/683 |
| 2007/0076595 A1 * | 4/2007 | Lee et al. | 370/222 |
| 2007/0241739 A1 * | 10/2007 | Uenou et al. | 324/76.17 |

* cited by examiner

Primary Examiner—Carol S Tsai (57) ABSTRACT

A monitoring system capable of being operationalized. Power consumption is electrical devices is monitored by the use of new and innovative consumption power monitoring device in accordance with the present invention. Power consumption information is collected by an intelligent power hub that is communicatively coupled to a remote server that presents overall power usage displays. A method of operationalizing a power usage monitoring system comprises powering up an energy pump device when the energy pump device is plugged into a first power socket, setting the energy pump device automatically to a SET mode to acquire new monitoring devices, and discovering the presence of a power consumption monitoring device.

20 Claims, 4 Drawing Sheets

OPERATIONALIZING A POWER USAGE MONITORING SYSTEM

CROSS REFERENCES TO RELATED APPLICATIONS

The present patent application is related to and makes reference to a co-pending application, entitled "A MONITORING SYSTEM FOR COLLECTION AND DISTRIBUTION OF A POWER CONSUMPTION INFORMATION", filed on Mar. 30, 2009, Ser. No. 12/383,943.

The present patent application is also related to and makes reference to a co-pending application, entitled "WEB BASED MONITORING, MANAGEMENT AND CONTEST BASED ON COLLECTED POWER CONSUMPTION DATA", filed on Mar. 30, 2009, Ser. No. 12/383,931.

The complete subject matter of the two above-referenced United States Patent Applications is hereby incorporated herein by reference, in their entirety. The present patent application and the above-referenced United States Patent Applications share the same inventors and have the same filing date.

BACKGROUND

1. Technical Field

The present invention relates generally to energy saving and power consumption monitoring and particularly to operationalizing a power usage monitoring system that comprises a plurality of power consumption monitoring devices.

2. Related Art

Power consuming appliances are becoming ubiquitous. People use electrical tools and appliances all over their residences. Some electrical appliances are turned on and seldom turned off, even when the user does not need the appliance or make use of it. Most people living in a modern house have a TV, a refrigerator, a washing machine, a washer, a dryer, a heating system, an air conditioner, etc. Most of these devices consume a lot of power when they are plugged into power outlets, some even when they are not being used.

Every day people use a lot of electricity for running electrical tools and appliances but they don't know which appliances are consuming how much power. Every month people get an electric bill and they would like to lower it, but they do not know how to reduce their monthly electrical bill. Every year mankind adds to global warming but we do not individually have an easy way to help reduce global warming. People do not seem to be able to control power consumption at their homes and work places.

Unfortunately, despite widespread acceptance of green house effects and despite rise in the price of crude oil, people have not been provided with effective power saving technologies. People are being encouraged to turn off light bulbs when they are not in a room. Some appliance can be turned off if they are not being used. However, turning off a refrigerator when a user is travelling it is not an option as food stored in the refrigerator is likely to get spoiled when it is turned off.

Often people do not know how much power they can save by following all the typical power saving recommendations. Well meaning individuals have no idea how effective all their power saving efforts has been. Even if one were to use green electrical appliances, one does not know if one can be more effective in saving power by adopting better usage patterns.

Most residential buildings have an electric meter or energy meter that measures the amount of electrical energy supplied to a residence or business. The most common type is a kilowatt hour meter. Typically, the utilities record the values measured by these meters to generate an invoice for the electricity. They may also record other variables including the time when the electricity was used. People are sent electricity usage bills by the utilities periodically.

Most modern electricity meters operate by continuously measuring the instantaneous voltage (in volts) and current (in amperes) and finding the product of these to give instantaneous electrical power (in watts) which is then integrated against time to give energy used (joules, kilowatt-hours etc). The meters fall into two basic categories, electromechanical and electronic. Electric meters are usually installed outside residential neighborhoods to enable meter readers associated with the utilities to stop by and read the meters to prepare a monthly bill. These electric meters do not provide details of how energy efficient individual appliances are in a premises. They do not provide details of how the power is being consumed in the premises. Typically, a user does not get much information from these meters, as they are designed for a meter reader to collect a total usage data or billing information once a month or so.

There is a problem educating users on effective power management techniques that saves them money by reducing power consumption. There is a problem in sharing success stories when some users are able to significantly lower their electric bills by better management of power consumption at home. Quite often, these individuals who have lowered their electric bills do not know how much individual appliances have contributed towards the savings in energy bills.

In any monitoring system that monitors power usage of a set of appliances, with multiple possible components that potentially interact, it is often not clear how the components need to be started, which of those components need to be started first, etc. In addition, configuration of the multiple possible components is likely to depend upon usage of the system, and often such usage is not clearly defined. Thus, such systems often fail to operate or get unused due to operational problems.

In view of the foregoing considerations, it is clear that there is a need for an improved system and method for measuring power consumption and monitoring power usage.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE DRAWINGS

The present invention provides an elegant means of operationalizing a monitoring system that is capable of monitoring power consumption of individual appliances in a residence or building. The power consumption is monitored by the use of new and innovative meters and monitoring devices built in accordance with the present invention. Power consumption information is collected by an intelligent power hub (and in some embodiments, an energy pump device, an intelligent power meter or a collector device) and is communicated to a remote server for analysis, reporting and managing a power savings/green energy contest.

Figure 1:
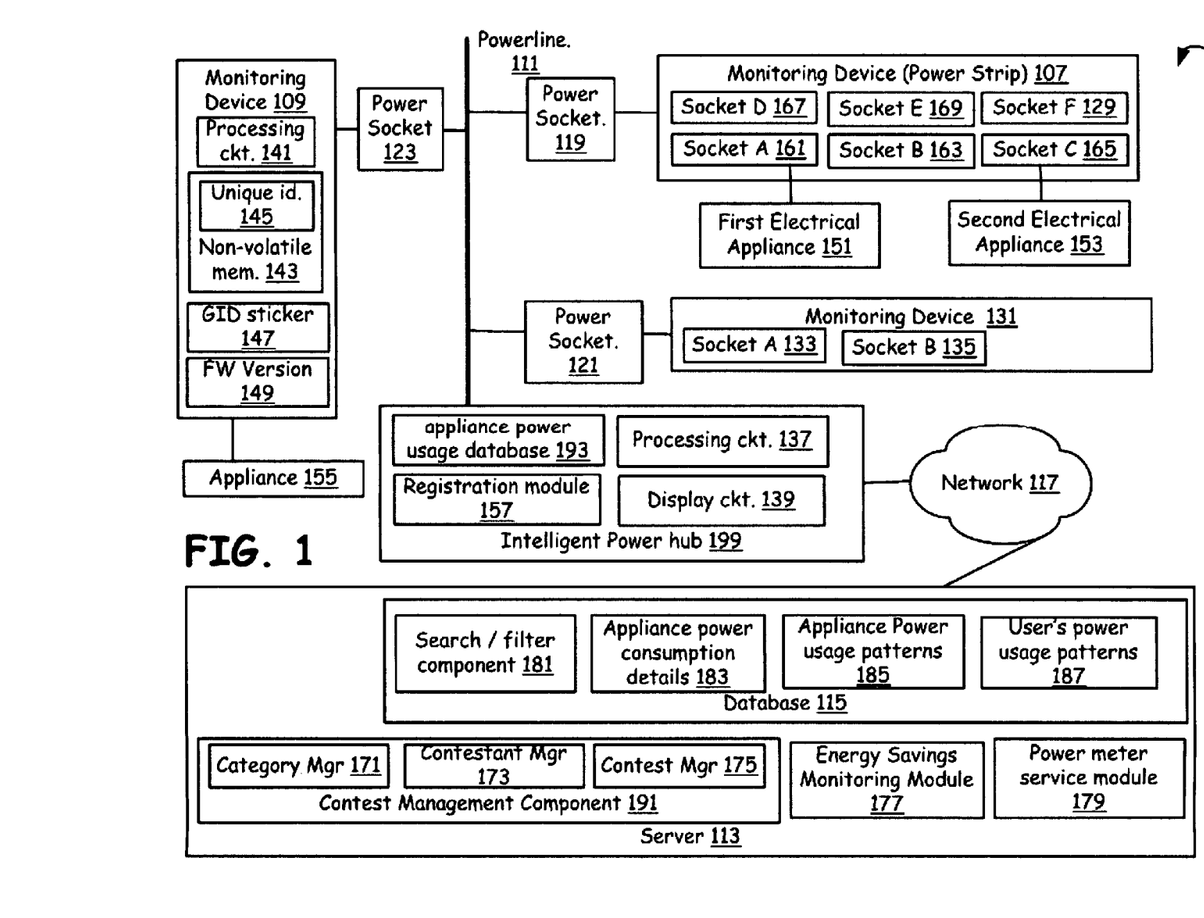
FIG. 1 is a monitoring system capable of being operationalized automatically or with user intervention, comprising a monitoring device and an intelligent power hub communicatively coupled the monitoring device wherein the monitoring system can be operationalized in accordance with the operationalization methods provided in the present invention.

FIG. 1 is a monitoring system 105 capable of being operationalized automatically or with user intervention, comprising a monitoring device 109 and an intelligent power hub 199 communicatively coupled the monitoring device 109 wherein the monitoring system 105 can be operationalized in accordance with the operationalization methods provided in the present invention. The intelligent power hub 199 is also communicatively coupled a remote server 113. The monitoring device 109 is capable of measuring energy consumed by an appliance 155 within a premises, wherein the appliance 155 is plugged into the monitoring device 109 and the monitoring device 109 is plugged into a power line 111 in the premises via a power socket 123.

The monitoring device 109 comprises a processing circuitry 141, a non-volatile memory 143 and a unique identification 145 programmed into the nonvolatile memory 143 that is human readable when displayed or printed. It measures the energy consumed by the appliance 155 that it is electrically coupled to. The monitoring device 109 communicates the energy consumed by the appliance 155 to an intelligent power hub 199 along with the unique identification 145, called green identification (GID) associated with the power socket of the monitoring device 109 into which the appliance 155 is plugged into.

The unique identification 145 is typically a green identification (GID) that is at least unique within the premises. The GID 145 is displayed on a sticker 147 affixed to one side of the monitoring device 109. In one embodiment, the GID 145 is embedded in a 2D machine readable barcode. The bar code is shown on the sticker 147. The sticker 147 containing the GID 145 is displayed on a surface of the monitoring device 109.

In one embodiment, the GID 145 comprises a checksum that enables validation of the monitoring device 109. A registration module 157 in the intelligent power hub 199 registers the GID received from the monitoring device 109, such as during startup, and associates it with the monitoring device 109 and its associated appliance 155. The intelligent power hub 199 validates the GID when a user enters a GID during a manual registration operation, such as at a remote server 133, or on a user input screen provided by the intelligent power hub 199. The user can use the intelligent power hub 199 to enter GIDs for monitoring devices 109, 107, used in the premises. Once the intelligent power hub 199 receives a GID information for a monitoring device 109 from the user, or automatically collects the GID, it validates the GID of the monitoring device 109 when the monitoring device 109 subsequently communicates a power usage data associated with the appliance 155.

A firmware version 149 is typically associated with the monitoring device 109. Monitoring devices 107, 109 from a manufacturer that are of a specific type are assigned a range of GID numbers, in one embodiment. Thus, where a range of GID numbers is assigned to a device type and a manufacturer identification, the monitoring system 105 maintains a mapping of the range of GIDs to a firmware version 149. Thus, updates of firmware can be sent targeting specific monitoring devices 109 based on known GIDs.

The monitoring device 109 contains a plastic based housing that houses the monitoring device 109. In one embodiment, where a monitoring device 131 supports a pair of appliances, and comprises a pair of electrical sockets 133, 135, the electrical sockets are labeled A and B on the plastic based housing.

In a different embodiment, where the monitoring device 107 comprises a plurality of monitored power sockets and is capable of monitoring a plurality of electrical appliances, a plastic based housing is used that houses the monitoring device 107, and appropriate labels are provided for the monitored power sockets 161, 163, 165, 167, 169, 129. In a related embodiment, the monitoring device 107 is an energy efficient power usage monitoring power strip with sockets labeled A 161, B 163, C 165, D 167, E 169, F 129 on the plastic based housing—the sockets 161, 163, 165, 167, 169, 129 being disposed on one side of the energy efficient power usage monitoring power strip 107.

The intelligent power hub 199 typically comprises a processing circuitry 137, a display circuitry 139 for displaying a list comprising the monitoring device identifications, a communication circuitry (not shown) and a set of navigation and selection buttons (not shown). For example, in a related embodiment, the navigation and selection buttons comprise at least the buttons from the group of buttons: Up, Down, Left, Right and Enter.

Power consumption information is collected by the intelligent power hub 199 that is communicatively coupled to the remote server 113. The remote server 113 presents a user overall power usage displays based on power usage information collected and computed over time. An examplary method of operationalizing the power usage monitoring system 105 comprises powering up the intelligent power hub 199 when the intelligent power hub 199 is turned on (or plugged into a power socket if necessary) and power is provided on the powerline 111, then setting intelligent power hub 199 automatically to a SET mode to acquire new monitoring devices, and discovering the presence of a monitoring devices 109, 107, 131.

Figure 2:
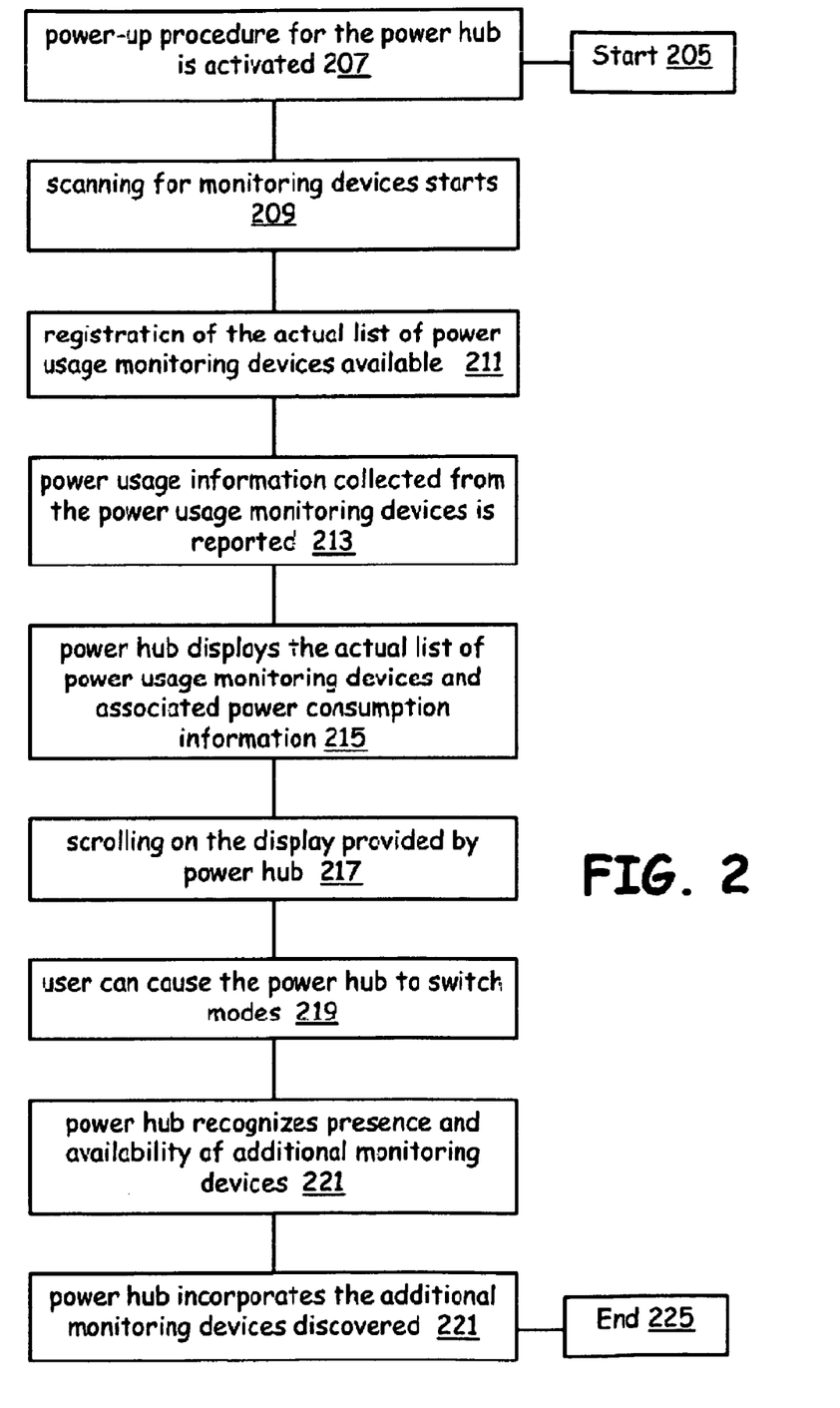
FIG. 2 is a flow chart of an exemplary operation of the monitoring system as it is operationalized to monitor power usage by appliances in a premises such as during initial setup.

FIG. 2 is a flow chart of an exemplary operation of the monitoring system 105 as it is operationalized to monitor power usage by appliances 151, 153, 155 in a premises such as during initial setup. Thus, it describes an exemplary out-of-the-box operationalizing process. At a start block 205, the processing starts when the power hub is connected to a powerline, by plugging it into a power socket associated with the powerline. Then, at a next block 207, the power-up procedure for the power hub is activated when the power hub is electrically coupled to a power socket associated with a powerline in the premises.

Then, at a next block 209, scanning for monitoring devices starts by the power hub. Scanning is conducted by the power hub to determine an actual list of active power usage monitoring devices available in the premises, wherein the actual list of active power usage monitoring devices are each communicatively coupled to the power hub when they are powered up. Such communicative coupling can occur over the powerline or over other means such as Bluetooth or WiFi based protocols. Then, at a next block 211, registration of the actual list of power usage monitoring devices 107, 109 131 available in the premises occurs. Such registration occurs automatically with a remote server communicatively coupled to the power hub, or manually conducted by the user, or both.

Then, at a next block 213, reporting occurs. A power usage information collected from the power usage monitoring devices is reported to the remote server by the power hub. Then at a next block 215, the power hub displays the actual list of power usage monitoring devices and their associated power consumption information when requested by a user, such as by the manipulation of a user interface provided by the power hub. Then, at a next block 217, scrolling on the display provided by the power hub is facilitated. The user can employ scrolling action using buttons provided on the power hub. Then, at a next block 219, the user can cause the power hub to switch modes. Switching of mode, by the power hub, such as from a RUN mode to a SET mode is possible when the user activates a mode change using appropriate buttons. Then, at a next block 221 the power hub is capable of recognizing the presence and availability of additional monitoring devices. At a next block 223, the power hub incorporates the additional monitoring devices discovered by the power hub to create an updated actual list of power monitoring devices. Processing then terminates at the end block 225.

In one embodiment, at the block 209, scanning is conducted such that monitoring devices from adjacent/nearby premises are eliminated. This involves first noting an initial list of power usage monitoring devices that are encountered prior to the powering of any of an actual set of power usage monitoring devices associated with the user. Then determining a reported set of power usage monitoring devices as they are powered up. And finally, eliminating the initial list of power usage monitoring devices from the reported set of power usage monitoring devices thereby creating the actual list of power usage monitoring devices. In one related embodiment, determining involves capturing a GID from each of the reported set of power usage monitoring devices as those devices are powered up and then storing them. Storing the captured GID from each of the reported set of power usage monitoring devices occurs in a nonvolatile memory associated with the power hub.

In general, capturing of GIDs of power usage monitoring devices is conducted by the power hub. Capturing is conducted by first broadcasting, by each of the reported set of power usage monitoring devices, a device code indicating that it is a new device and then by handshaking, by each of the reported set of power usage monitoring devices, with the power hub. This is followed by the power usage monitoring devices becoming operational to push watt hours data to the remote server. Thus, each of the reported set of power usage monitoring devices provide their GIDs to the power hub which can then determine which of these are actual devices involved in a power usage monitoring network in the premises.

Reporting typically comprises setting the state of the power hub to a SET mode initially, then changing the state of the power hub to a RUN mode either automatically or upon user action, and finally communicating, by the power hub, the power usage information for each of the actual list of power usage monitoring devices to the remote server.

Figure 3:
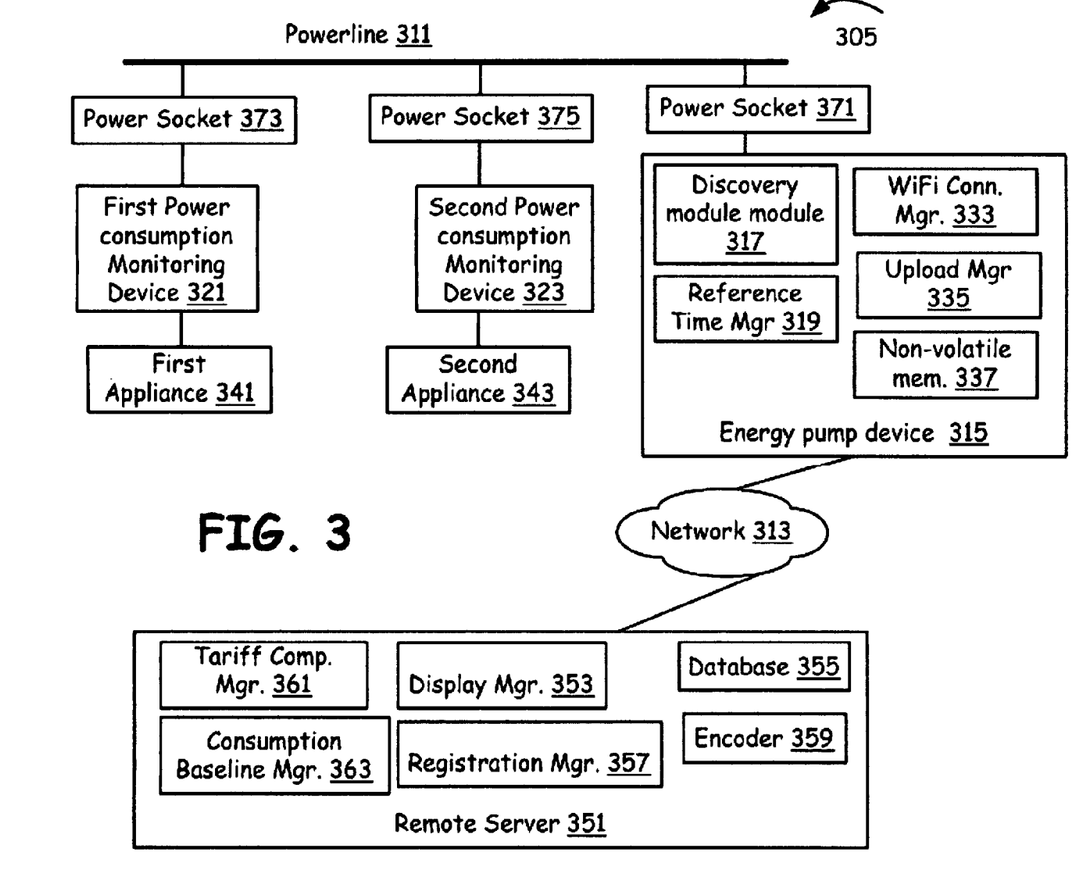
FIG. 3 is a perspective block diagram of a monitoring system that can be operationalized during initial setup in a premises, wherein the premises comprises a powerline and a plurality of appliances.

FIG. 3 is a perspective block diagram of a monitoring system 305 that can be operationalized during initial setup in a premises, wherein the premises comprises a powerline 311 and a plurality of appliances 341, 343. The monitoring system 305 comprises a new energy pump device 315 that is plugged into a power socket 371 associated with the powerline 311 in the premises (or directly connected to the powerline 111). Powering up of the energy pump device 315 results in the discovery of the monitoring devices 321, 323. For example, when a power button on the energy pump device 315 is turned ON, startup operation begins. This happens after the energy pump device 315 is plugged into a power socket 371. Typically, the power socket 371 is electrically coupled to the powerline in the premises. The energy pump device is supplied electrical power from the powerline via the power socket.

The initial setup of the energy pump device 315 is initiated automatically when the energy pump device 315 is powered up. It is set in a SET mode to acquire new power consumption monitoring devices such as 321, 323. When the energy pump device 315 is initially supplied electrical power from the powerline 311, it starts operations in the SET mode. Later, the energy pump device 315 starts discovering the presence of the power consumption monitoring devices 321, 323, after those power consumption monitoring devices 321, 3223 are plugged in to the powerline 311 via appropriate power sockets 373, 375. For example, when the power consumption monitoring device 321 is plugged in to the powerline 311, the energy pump device 315 is already powered up and ready to discover new power consumption monitoring devices.

The monitoring system 305 comprises a remote server 351 that comprises a tariff computation manager 361, a consumption baseline manager 363, a display manager 353, a user registration manager 357, a database 355 and an encoder 359.

The monitoring system 305 supports registering by a user with the remote server 351, employing the user's email address, a password and a supplied GID. The user can employ appropriate web pages provided by the remote server 351 for such registrations. The remote server 351 associates the user (using the user's identify, or profile) with the energy pump device 315 employing a GID associated with the energy pump device 315. The remote server 351 also associates a captured GID of the first power consumption monitoring device 321 with the power usage computation for the associated appliance 341 and related data. The remote server 351 also computes a user's tariff plan employing the tariff computation manager 361, and a user's current daily energy consumption baseline employing the consumption baseline manager 363.

The remote server 351 presents an energy saved data, a money saved data and a energy efficiency model to the user, at least partially based on the user's tariff plan and the user's current daily energy consumption baseline computed for that user. For example, the remote server 351 presents such information to the user using one or more web pages available when the user access such web pages using a PC or the energy pump device 315.

Figure 4:
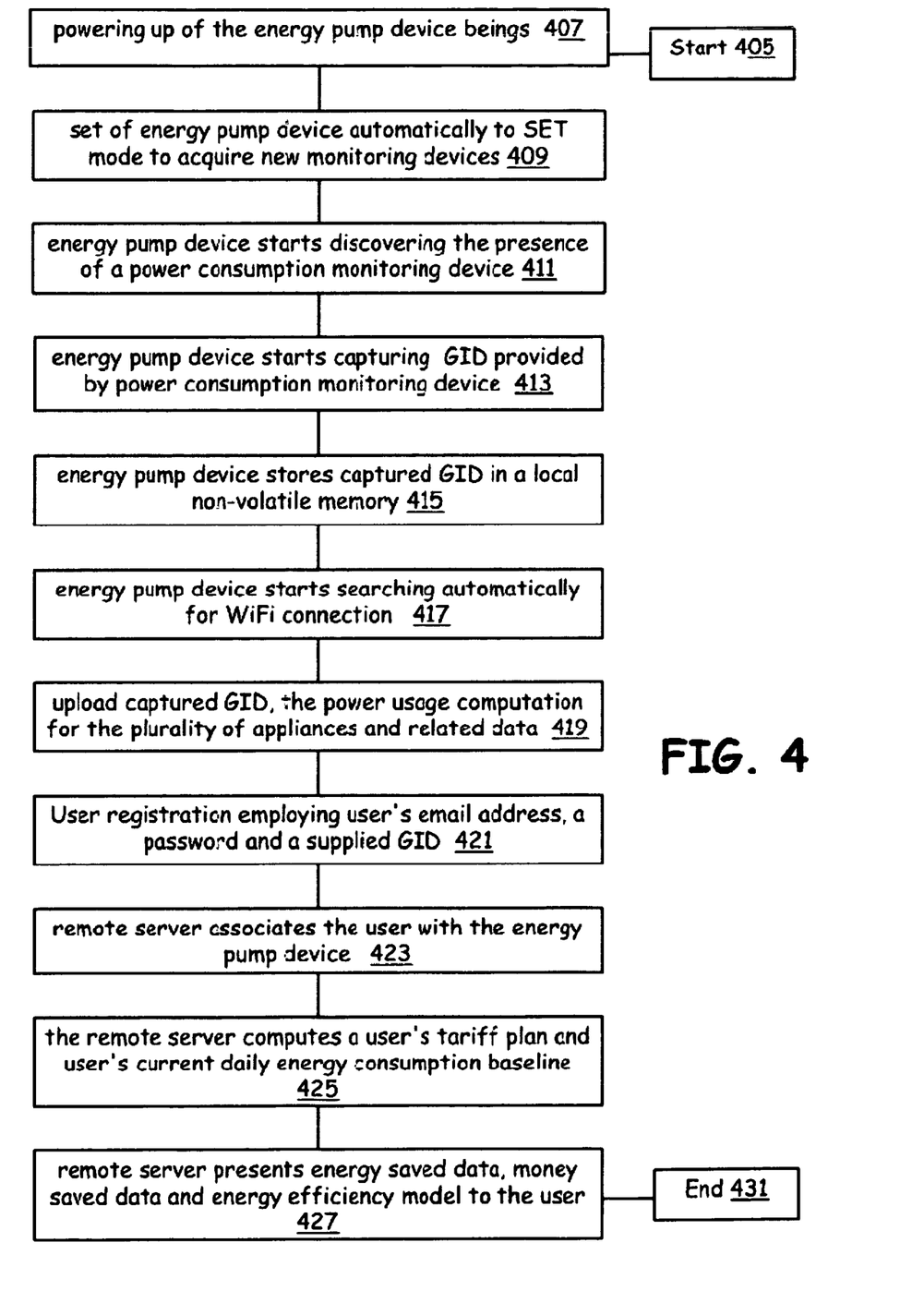
FIG. 4 is a flow chart of an exemplary operationalizing activity for a power usage monitoring system built in accordance with the present invention.

FIG. 4 is a flow chart of an exemplary operationalizing activity for a power usage monitoring system built in accordance with the present invention. At a start block 405, processing starts when a new energy pump device is plugged into a power socket associated with a powerline in a premises. Then, at a next block 407, powering up of the energy pump device begins when the energy pump device is started (power button turned ON) after being plugged into a first power socket. Typically, the first power socket is electrically coupled to the powerline in the premises. The energy pump device is supplied electrical power from the powerline via the first power socket.

Then, at a next block 409, the setting of the energy pump device automatically to a SET mode to acquire new monitoring devices occurs, when the energy pump device is initially supplied electrical power from the powerline. Then, at a next block 411, the energy pump device starts discovering the presence of a power consumption monitoring device, after the power consumption monitoring device is plugged in to the powerline via a second power socket. The power consumption monitoring device is plugged in to the powerline typically after the energy pump device is plugged into the first power socket.

Later, at a next block 413, the energy pump device starts capturing a GID provided by (that is stored in) the power consumption monitoring device. Then, at a next block 415, the energy pump device stores the captured GID in a local non-volatile memory available in the energy pump device. Then, at a next block 417, the energy pump device starts searching automatically for a WiFi connection to communicate over Internet. It then connects automatically with a selected WiFi access point based on signal strength and optional security parameters. It then, at a next block 419 starts uploading the captured GID, the power usage computation for the plurality of appliances and related data to a remote server for processing and subsequent web display (using appropriate web pages provided by the remote server).

At a next block 421, the monitoring system supports registering, by the remote server, a user employing the user's email address, a password and a supplied GID. The user can employ appropriate web pages provided by the remote server for such registrations. Then, at a next block 423, the remote server associates the user (his identify, or profile) with the energy pump device (through its GID, for example), the captured GID of the monitoring device, the power usage computation for the plurality of appliances and related data. Then, at a next block 425, the remote server, computes a user's tariff plan and a user's current daily energy consumption baseline. Later, at a next block 427, the remote server presents an energy saved data, a money saved data and a energy efficiency model to the user, at least partially based on the user's tariff plan and the user's current daily energy consumption baseline. For example, the remote server presents such information to the user using one or more web pages when the user access such web pages using a PC or the energy pump device. The operation finally terminates at an end block 431.

The power consumption monitoring device is capable of monitoring power consumption by a plurality of appliances electrically coupled to the power consumption monitoring device. A user can see the display of power consumption by each of the plurality of appliances. Displaying the list of the plurality of appliances is supported by the energy pump device using a display module provided by the energy pump device. The energy pump device is capable of showing the power usage computation for the plurality of appliances on the display module.

As one of ordinary skill in the art will appreciate, the terms "operably coupled" and "communicatively coupled," as may be used herein, include direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled" and "communicatively coupled."

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A method of operationalizing a power usage monitoring system, the method comprising:
   powering a power hub when the power hub is electrically coupled to a power socket associated with a powerline in a premises;
   scanning, by the power hub to determine an actual list of active power usage monitoring devices available in the premises, wherein the actual list of active power usage monitoring devices are communicatively coupled to the power hub when they are powered up;
   registering, the actual list of power usage monitoring devices available in the premises with a remote server communicatively coupled to the power hub; and
   reporting power usage information collected by the power usage monitoring devices to the remote server.

2. The method of claim 1 wherein scanning comprises:
   noting, an initial list of power usage monitoring devices that are encountered prior to the powering of any of an actual set of power usage monitoring devices associated with the user;
   determining a reported set of power usage monitoring devices as they are powered up; and
   eliminating the initial list of power usage monitoring devices from the reported set of power usage monitoring devices thereby creating the actual list of power usage monitoring devices.

3. The method of claim 2 wherein determining comprises:
   capturing a GID from each of the reported set of power usage monitoring devices as those devices are powered up; and
   storing the captured GID from each of the reported set of power usage monitoring devices in a nonvolatile memory associated with the power hub.

4. The method of claim 3 wherein capturing comprises:
broadcasting, by each of the reported set of power usage monitoring devices, a device code indicating that it is a new device;
handshaking, by each of the reported set of power usage monitoring devices, with the power hub; and
becoming operational to push watt hours data to the remote server, by each of the reported set of power usage monitoring devices.

5. The method of claim 2 wherein reporting comprises:
setting the state of the power hub to a SET mode initially;
changing the state of the power hub to a RUN mode either automatically or upon user action; and
communicating, by the power hub, the power usage information for each of the actual list of power usage monitoring devices to the remote server.

6. The method of claim 1 further comprising:
displaying, by the power hub, the actual list of power usage monitoring devices and their associated power consumption information; and
scrolling the display, by the power hub, upon user scroll action.

7. The method of claim 6 further comprising:
switching mode, by the power hub, from a RUN mode to a SET mode when the user activates a mode change;
recognizing the presence and availability of additional monitoring devices by the power hub; and
incorporating the additional monitoring devices by the power hub to create an updated actual list of power monitoring devices, by the power hub.

8. A monitoring system with a monitoring device that can be operationalized, the monitoring system comprising:
an intelligent power hub communicatively coupled the monitoring device and to a remote server; and
the monitoring device capable of measuring energy consumed by an appliance within a premises, the monitoring device comprising:
a processing circuitry;
a non-volatile memory;
a unique identification programmed into the nonvolatile memory that is human readable when displayed or printed;
the monitoring device measuring the energy consumed by the appliance that the monitoring device is electrically coupled to; and
the monitoring device communicating the energy consumed to a power hub along with the unique identification.

9. The monitoring system of claim 8 wherein the unique identification is a green identification (GID) that is at least unique within the premises.

10. The monitoring system of claim 9 wherein the GID is displayed on a sticker affixed to one side of the monitoring device.

11. The monitoring system of claim 9 wherein a 2D machine readable barcode containing the GID is displayed on a surface of the monitoring device.

12. The monitoring system of claim 9 wherein the GID comprises a checksum that enables validation, the monitoring device further comprising:
a registration module in the intelligent power hub that registers the GID and associates it with the monitoring device;
the intelligent power hub validating the GID when a user enters a GID during a manual registration operation employing the intelligent power hub; and
the intelligent power hub validating the GID of the monitoring device when the monitoring device communicates a power usage data associated with the appliance.

13. The monitoring system of claim 9 wherein a firmware version is associated with the monitoring device and wherein a range of GID numbers, assigned to a device type and a manufacturer identification, is mapped to the firmware version.

14. The monitoring system of claim 9 wherein the monitoring device further comprises:
a plastic based housing that houses the monitoring device; and
a pair of electrical sockets labeled A and B on a plastic based housing.

15. The monitoring system of claim 9 wherein the monitoring device further comprises:
a plastic based housing that houses the monitoring device; and
wherein the monitoring device is an energy efficient power usage monitoring power strip with sockets labeled A, B, C, D, E, F on the plastic based housing, the sockets disposed on one side of the energy efficient power usage monitoring power strip.

16. The monitoring system of claim 9 wherein the intelligent power hub comprises:
a second processing circuitry;
a display circuitry for displaying a list comprising the monitoring device identification; and
a navigation and selection buttons comprising at least the buttons from the group of buttons: Up, Down, Left, Right and Enter.

17. A method of operationalizing a power usage monitoring system, the method comprising:
powering up an energy pump device when the energy pump device is plugged into a first power socket, wherein the first power socket is electrically coupled to a powerline in a premises and wherein the energy pump device is supplied electrical power from the powerline via the first power socket;
setting the energy pump device automatically to a SET mode to acquire new monitoring devices when the energy pump device is initially supplied electrical power from the powerline;
discovering the presence of a power consumption monitoring device when the power consumption monitoring device is plugged in to the powerline via a second power socket, after the energy pump device is plugged into the first power socket;
capturing, by the energy pump device, a GID from the power consumption monitoring device; and
storing, by the energy pump device, the captured GID in a local non-volatile memory available in the energy pump device.

18. The method of operationalizing from claim 17 wherein the power consumption monitoring device is capable of monitoring power consumption by a plurality of appliances electrically coupled to the power consumption monitoring device, the method further comprising:
displaying a list of the plurality of appliances on a display module provided by the energy pump device; and
showing the power usage computation for the plurality of appliances on the display module.

19. The method of operationalizing from claim 18, the method further comprising:

searching automatically, by the energy pump device, for a WiFi connection to communicate over Internet;

connecting automatically with a selected WiFi access point based on signal strength and optional security parameters; and uploading the captured GID, the power usage computation for the plurality of appliances and related data to a remote server for processing and web display.

20. The method of operationalizing from claim 19, the method further comprising:

registering, by the remote server, a user employing the user's email address, a password and a supplied GID;

associating, by the remote server, the user with the energy pump device, the captured GID, the power usage computation for the plurality of appliances and related data;

computing, by the remote server, a user's tariff plan and a user's current daily energy consumption baseline; and presenting, by the remote server, an energy saved data, a money saved data and a energy efficiency model to the user, at least partially based on the user's tariff plan and the user's current daily energy consumption baseline.

* * * * *